US007669162B2

(12) United States Patent
Kobayashi et al.

(10) Patent No.: US 7,669,162 B2
(45) Date of Patent: Feb. 23, 2010

(54) INTEGRATED POWER SUPPLY SYSTEM ANALYZING SYSTEM, INTEGRATED POWER SUPPLY SYSTEM ANALYZING METHOD, AND MULTIPLAYER PRINTED CIRCUIT BOARD

(75) Inventors: Naoki Kobayashi, Tokyo (JP); Takashi Harada, Tokyo (JP)

(73) Assignee: NEC Corporation, Tokyo (JP)

( * ) Notice: Subject to any disclaimer, the term of this patent is extended or adjusted under 35 U.S.C. 154(b) by 454 days.

(21) Appl. No.: 11/547,200

(22) PCT Filed: Mar. 30, 2005

(86) PCT No.: PCT/JP2005/006721

§ 371 (c)(1),
(2), (4) Date: Dec. 4, 2006

(87) PCT Pub. No.: WO2005/096188

PCT Pub. Date: Oct. 13, 2005

(65) Prior Publication Data

US 2008/0270964 A1     Oct. 30, 2008

(30) Foreign Application Priority Data

Mar. 30, 2004    (JP)    ............................... 2004-101155

(51) Int. Cl.
*G06F 17/50*    (2006.01)
(52) U.S. Cl. .................................. 716/15; 716/2; 716/5
(58) Field of Classification Search .................. 716/1–5, 716/8, 15
See application file for complete search history.

(56) References Cited

U.S. PATENT DOCUMENTS

| | | | |
|---|---|---|---|
| 6,557,154 B1 * | 4/2003 | Harada et al. | .................. 716/11 |
| 6,871,334 B2 * | 3/2005 | Mabuchi et al. | ................. 716/5 |
| 2003/0109995 A1 * | 6/2003 | Mabuchi et al. | ............... 702/64 |

FOREIGN PATENT DOCUMENTS

| JP | 2002-64279 A | 2/2002 |
|---|---|---|
| JP | 2002-064279 A | 2/2002 |
| JP | 2002-351937 A | 6/2002 |
| JP | 2002-351937 A | 12/2002 |
| JP | 2003-6260 A | 1/2003 |
| JP | 2003-006260 A | 1/2003 |

OTHER PUBLICATIONS

Takashi Harada, et al., "Power-Distribution-Plane Analysis for Multilayer Printed Circuit Boards with Spice", 2000 IEMT/IMC Symposium, Apr. 19-21, pp. 420-425.

* cited by examiner

*Primary Examiner*—Paul Dinh
(74) *Attorney, Agent, or Firm*—Sughrue Mion, PLLC

(57) ABSTRACT

Information related to a structure of a multilayer printed circuit board, a physical constant and a mesh is input (Step S701) to generate an equivalent circuit model of the multilayer printed circuit board (Step S702). A transfer matrix is generated with an LSI power source terminal mounting candidate point of the uppermost layer as an input and an LSI power source terminal mounting candidate point of the lowermost layer as an output (Step S703) and the transfer matrix is converted into an impedance matrix (Step S704). Here, a first LSI mounting point is input (Step S705) to select an optimum LSI mounting point (Step S706) and the optimum LSI mounting point and the remaining LSI mounting candidate points are sequentially output (Step S707).

13 Claims, 13 Drawing Sheets

US 7,669,162 B2

INTEGRATED POWER SUPPLY SYSTEM ANALYZING SYSTEM, INTEGRATED POWER SUPPLY SYSTEM ANALYZING METHOD, AND MULTIPLAYER PRINTED CIRCUIT BOARD

This application claims priority from PCT Application No. PCT/JP2005/006721 filed Mar. 30, 2005, and from Japanese Patent Application No. 2004-101155 filed Mar. 30, 2004, which applications are incorporated herein by reference.

FIELD OF THE INVENTION

The present invention relates to an integrated power source system analysis system integrating power design of an LSI and a multilayer printed circuit board which enables interconnection of power source systems of a plurality of LSIs (Large Scale Integrated Circuit), an integrated power source system analysis method and a multilayer printed circuit board.

DESCRIPTION OF THE RELATED ART

Along with speed-up of electronic equipment, the problem of power source system noise of a multilayer printed circuit board mounted with an LSI becomes conspicuous. In particular, resonance generated between power source and ground planes of a multilayer printed circuit board which is derived from power source system noise causes a power source voltage on the LSI side to fluctuate largely to degrade properties of the LSI. Accordingly, in designing an LSI, it is essential to make design taking information of a multilayer printed circuit board into consideration.

As a conventional method of power source analysis limited to a printed circuit board, there exists a method recited in Literature 1 (T. Harada and other three persons: "Power-Distribution-Plane Analysis for Multilayer Printed Circuit Boards with SPICE", Proceeding of 2000 IEMT/IMC Symposium, April 2000, pp. 420-425). Recited in the above Literature 1 is approximating power source-ground planes by a plane circuit, creating an equivalent circuit model after generating a micro mesh and with a portion of junction between a power source terminal of an LSI and a printed circuit board as a feeding point, obtaining an impedance as obtained when the printed circuit board side is seen from the power source terminal side of the LSI by using a circuit solver such as an SPICE (Simulation Program with Integrated Circuit Emphasis).

In the following, a conventional method of analyzing a printed circuit board will be described in brief with reference to drawings. FIG. 11 is a diagram for use in explaining a structure of a multilayer printed circuit board including a pair of power source-ground planes and a pair of power source-ground terminals for mounting an LSI. As shown in FIG. 11, an LSI package 1100 has a power source terminal 1101 and a ground terminal 1102. In addition, the printed circuit board is formed of a stack of, sequentially from the bottom, a dielectric layer 1105, a power source plane 1107, the dielectric layer 1105, a ground plane 1106 and the dielectric layer 1105. On the uppermost surface of the printed circuit board, a power source terminal 1103 and a ground terminal 1104 are formed, and the power source plane 1107 and the power source terminal 1103 are connected by a via 1108. In the ground plane 1106, a via hole 1109 for passing the above via 1108 is formed. On an actual printed circuit board, appropriately mounted as required other than these are such as a power source terminal and a ground terminal for direct current power source and further a pad for decoupling and a wiring for connecting the terminals.

FIG. 12 is a diagram showing an equivalent circuit model of a meshed pair of power source-ground planes shown in FIG. 11. 1201 is a top view of the equivalent circuit model of the power source-ground planes, which represents the power source plane as a circuit model. The power source plane with a horizontal side a and a vertical side b is formed of meshes of a horizontal side Δx and a vertical side Δy. 1202 shows one mesh of the circuit model 1201 of the power source plane as a specific circuit, with Rx and Ry representing resistors of the sides in the horizontal direction and the vertical direction, respectively, and Lx and Ly representing inductances in the horizontal direction and the vertical direction, respectively. 1203 is a side view of the equivalent circuit model of the power source-ground planes, with H representing a height of the power source-ground plane. 1204 specifically shows a circuit constant in one side of the height direction of the circuit model 1203, which includes a capacitance Cz and a conductance Gz. 1205 represents a ground point on the circuit.

FIG. 13 shows a model connected to the equivalent circuit model 1203 with a current flowing from the LSI power source terminal 1101 into the printed circuit board as a current source. 1302 is a side view taken out from the equivalent circuit model of the printed circuit board along the surface containing the LSI power source terminal 1101, with a current source 1301 which is obtained by modeling the LSI power source terminal 1101 connected to a node 1303 equivalent to a part containing the LSI power source terminal 1101 of the printed circuit board. By solving the model shown in FIG. 13 by using a SPICE, for example, a voltage distribution in each node will be obtained and by using a ratio between a voltage and a current of the node equivalent to the part containing the LSI power source terminal 1101, an impedance of the printed circuit board seen from the LSI power source terminal 1101 side will be obtained. Thus, it can be seen that using the impedance of the power source system on the printed circuit board side as a load of the power source-ground terminals of the LSI can be realized with relative ease by using a conventional method of analyzing a printed circuit board.

As described in the foregoing, when the number of LSIs mounted on the printed circuit board is one, simply incorporating information of a power source system on the printed circuit board side as a load of the power source-ground terminals enables power source design which integrates the LSI and the printed circuit board.

The above-described conventional technique, however, has the following problems. With the conventional printed circuit board analysis method recited in Literature 1, in which a relationship is simply modeled between a single LSI power source system and a power source system of a printed circuit board, designing taking interaction between power source systems of LSIs when a plurality of LSIs are mounted on the printed circuit board is impossible. Another problem is that because the technique copes only with a case where one pair of power source-ground planes exists, in actual printed circuit boards, it is not applicable to an actual multilayer printed circuit board having a plurality, two or more, of pairs of power source-ground planes.

SUMMARY OF THE INVENTION

An object of the present invention, which is proposed taking such problems as described above into consideration, is to provide an integrated power source system analysis system applicable to a multilayer printed circuit board having two or more pairs of power source-ground planes which takes interaction between LSI power source terminals with a printed circuit board provided therebetween into consideration when a plurality of LSIs are mounted on the multilayer printed circuit board, and an integrated power source system analysis method.

The integrated power source system analysis system according to the present invention is characterized in including a means for receiving input of information related to a structure of a multilayer printed circuit board having a plurality of candidate points at which a plurality of LSIs can be mounted and related to a physical constant, a means for receiving input of information related to a mesh for generating an equivalent circuit of the multilayer printed circuit board, a means for calculating an equivalent circuit constant based on the mesh information for generating an equivalent circuit, a means for calculating an impedance matrix with power source-ground terminals of the multilayer printed circuit board as an input by using the equivalent circuit constant, a means for selecting a place where a first LSI is to be mounted from among the LSI mounting candidate points, and a means for sequentially selecting a place where interaction with a power source supply system of the first LSI will hardly occur by using the impedance matrix from among the remaining LSI mounting candidate points obtained by excluding the first LSI mounting point from the LSI mounting candidate points.

In the present invention, with a plurality of power source-ground terminals for mounting LSIs on a multilayer printed circuit board as an input of a multi-port circuit network, an optimum LSI mounting point can be selected by generating an impedance matrix of a multilayer printed circuit seen from these power source terminals and making the use of the fact that power source systems of LSIs are liable to affect with each other between terminals whose mutual impedance absolute value is large.

The integrated power source system analysis system according to the present invention, enables application to a multilayer printed circuit board having two or more power source-ground planes by, at the time of generating the impedance matrix, generating an admittance matrix related only to a node having a via with an input current of a node having no via as 0 based on an expression of a relationship among an admittance matrix determined by meshing the multilayer printed circuit board, an input current and an input voltage and generating an impedance matrix by using the admittance matrix.

The integrated power source system analysis method according to the present invention is characterized in receiving input of information related to a structure of a multilayer printed circuit board having a plurality of candidate points at which a plurality of LSIs can be mounted and related to a physical constant, receiving input of information related to a mesh for generating an equivalent circuit of the multilayer printed circuit board, calculating an equivalent circuit constant based on the mesh information for generating an equivalent circuit, calculating an impedance matrix with power source-ground terminals of the multilayer printed circuit board as an input by using the equivalent circuit constant, selecting a place where a first LSI is to be mounted from among the LSI mounting candidate points, and sequentially selecting a place where interaction with a power source supply system of the first LSI will hardly occur by using the impedance matrix from among the remaining LSI mounting candidate points obtained by excluding the first LSI mounting point from the LSI mounting candidate points.

The multilayer printed circuit board according to the present invention is characterized in being mounted with a plurality of LSIs by using the order of LSIs mounting candidate points obtained by the integrated power source system analysis system recited in claim 1.

DESCRIPTION OF THE PREFERRED EMBODIMENT

Figure 1:
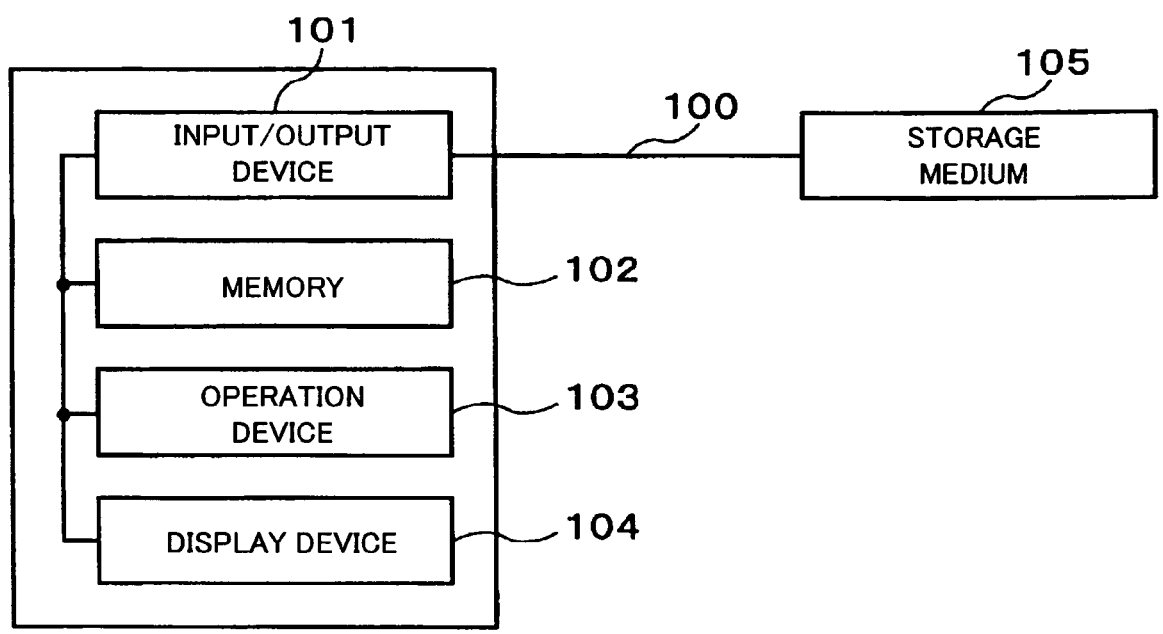
FIG. 1 is a diagram for use in explaining hardware architecture of the present invention.
Figure 2:
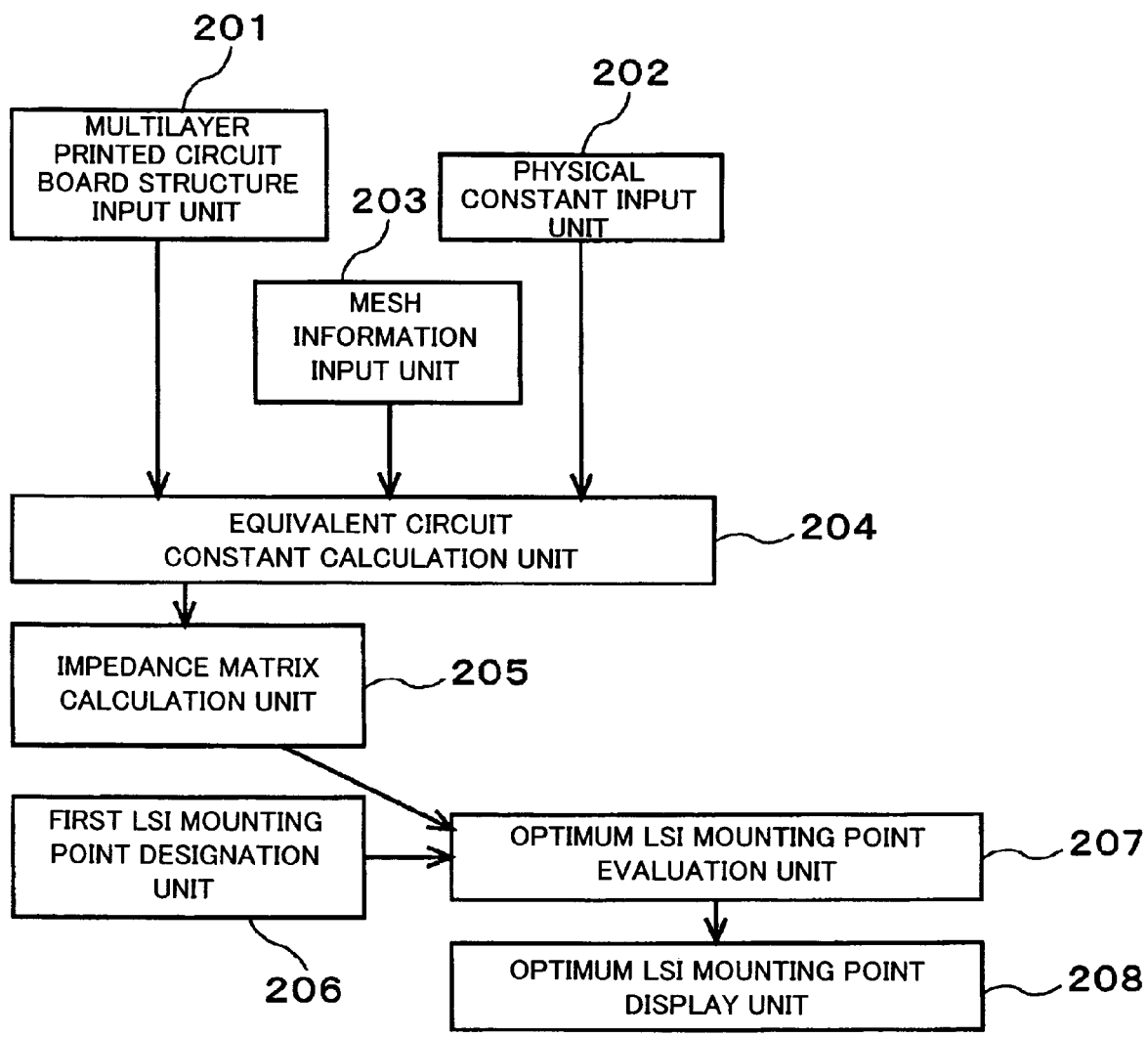
FIG. 2 is a block diagram for use in explaining a first embodiment of the present invention.

In the following, embodiments of the present invention will be specifically described with reference to the accompanying drawings. First, a first embodiment of the present invention will be described. FIG. 1 is a schematic diagram showing hardware architecture of an integrated power-source-system system according to the first embodiment of the present invention. As shown in FIG. 1, the integrated power source system analysis system according to the present embodiment includes an input/output device 101, a memory 102, an operation device 103 and a display device 104, with the input/output device 101 connected to a storage device 105 through a bus 100. In addition, FIG. 2 is a block diagram functionally showing the structure of the integrated power source system analysis system according to the present embodiment. The integrated power source system analysis system according to the present embodiment includes a multilayer printed circuit board structure information input unit 201, a physical constant input unit 202 and a mesh information input unit 203 which are connected to an equivalent circuit constant calculation unit 204. The equivalent circuit constant calculation unit 204 is connected to an impedance matrix calculation unit 205, and the impedance matrix calculation unit 205 is connected to an optimum LSI mounting point evaluation unit 207 together with a first LSI mounting point designation unit. Moreover, the optimum LSI mounting point evaluation unit 207 is connected to an optimum LSI mounting point display unit 208.

Figure 3:
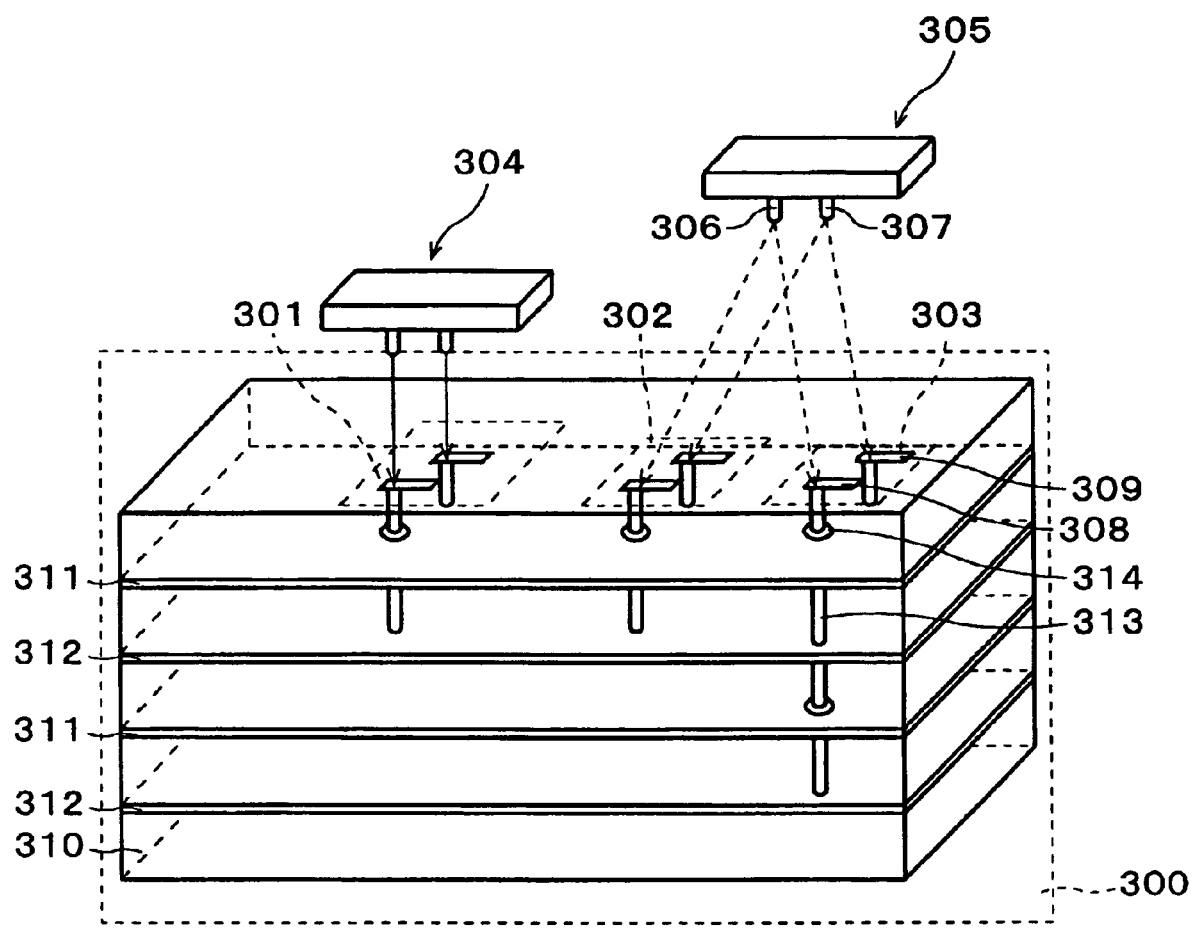
FIG. 3 is a diagram for use in explaining a structure of a multilayer printed circuit board including a plurality of power source-ground terminals for mounting LSIs and a plurality of pairs of power source-ground planes.
Figure 4:
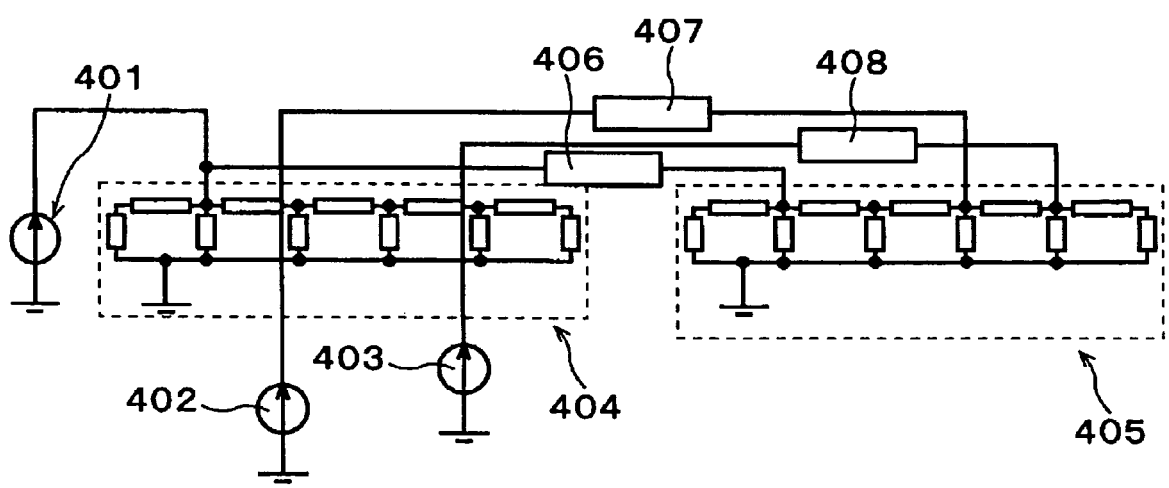
FIG. 4 is a diagram for use in explaining, as an equivalent circuit model, the multilayer printed circuit board including the plurality of power source-ground terminals for mounting LSIs and the plurality of pairs of power source-ground planes.

FIG. 3 is a diagram for use in explaining a structure of a multilayer printed circuit board including a plurality of power source-ground terminals for mounting an LSI and a plurality of pairs of power source-ground planes which is used for analysis of the integrated power source system analysis system according to the present embodiment. In addition, FIG. 4 shows the multilayer printed circuit board illustrated in FIG. 3 as an equivalent circuit. As shown in FIG. 3, a multilayer printed circuit board 300 is formed of a stack of, sequentially from the bottom, a dielectric layer 310, a power source plane 312, the dielectric layer 310, a ground plane 311, the dielectric layer 310, the power source plane 312, the dielectric layer 310, the ground plane 311 and the dielectric layer 310. On the uppermost surface of the printed circuit board, a port 301, a port 302 and a port 303 for mounting an LSI are formed and each port is formed of one pair of a power source terminal 308 and a ground terminal 309. The power source plane 312 and the power source terminal 308, and the ground plane 311 and the ground terminal 309 are connected by a via 313, respectively. In the ground plane 311, a via hole 314 for passing the via 313 through is formed. A power source terminal 306 and a ground terminal 307 of an LSI-1 package 304 are connected to the power source terminal 308 and the ground terminal 309 of the port 301, respectively. In addition, the power source terminal 306 and the ground terminal 307 of an LSI-2 package 305 are connected to the power source terminal 308 and the ground terminal 309 of the port 302 or the port 303, respectively. As shown in FIG. 4, current sources 401, 402 and 403 of the respective LSI power source terminals at the port 301, the port 302 and the port 303 are connected to an equivalent circuit 404 of a power source-ground plane pair in an upper layer and an equivalent circuit 405 of a power source-ground plane pair in a lower layer. The equivalent circuit 404 of the power source-ground plane pair in the upper layer and the equivalent circuit 405 of the power source-ground plane pair in the lower layer are connected by equivalent circuits 406, 407 and 408 of via parts which join the power source-ground plane pairs in the upper layer and the lower layer.

Figure 5:
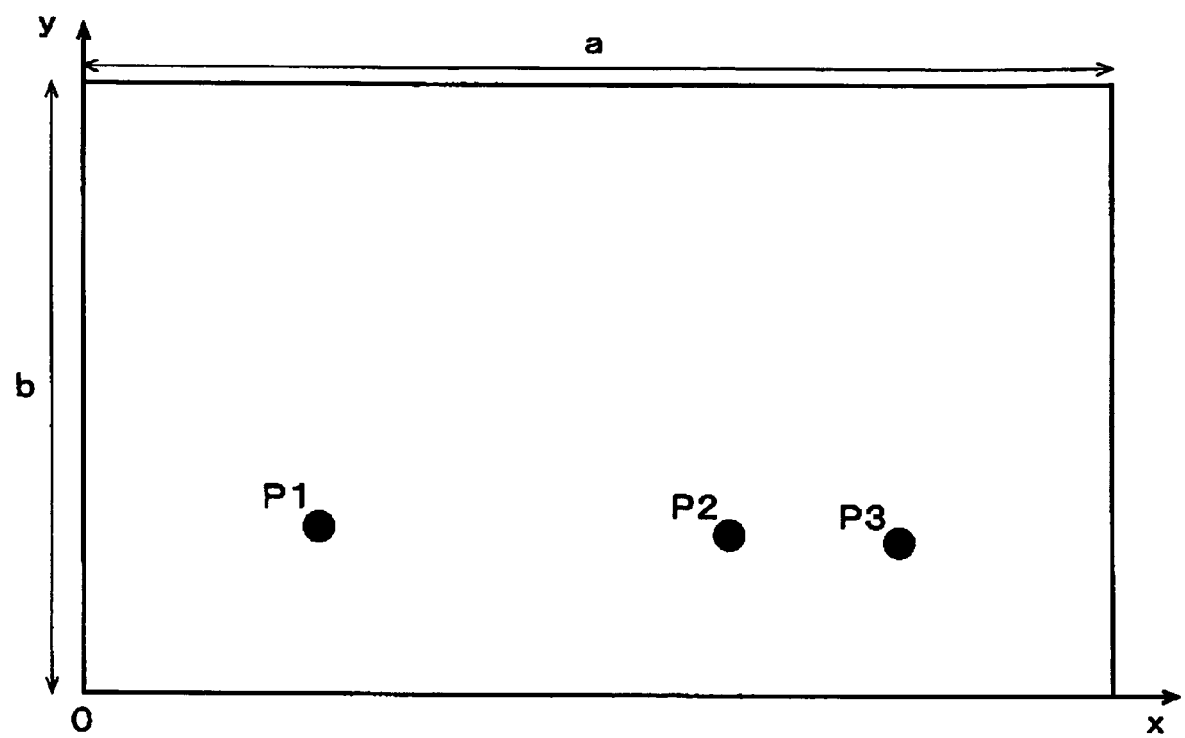
FIG. 5 is a top view of the multilayer printed circuit board including the plurality of power source-ground terminals for mounting LSIs and the plurality of pairs of power source-ground planes.
Figure 6:
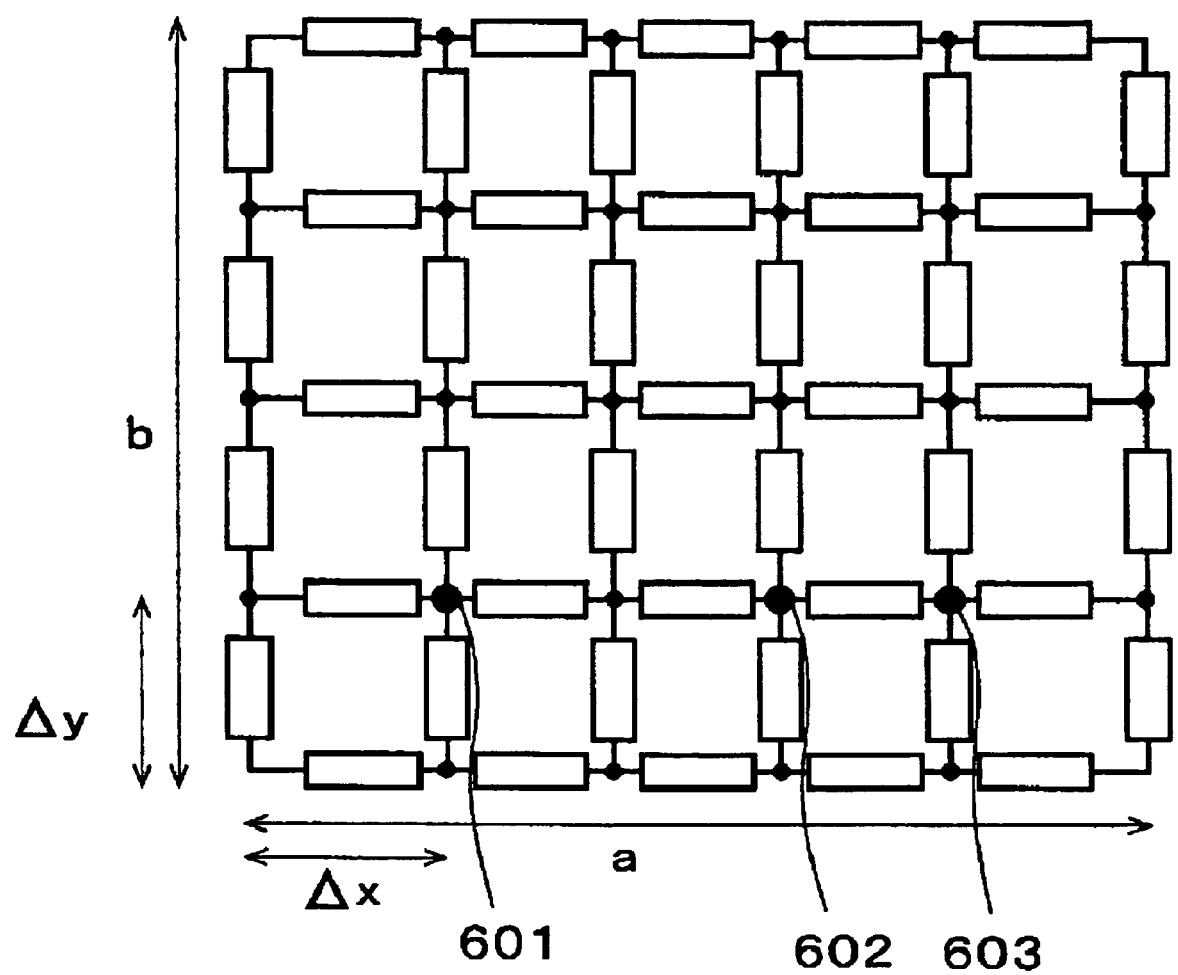
FIG. 6 is a diagram for use in explaining an equivalent circuit of the power source-ground planes.

FIG. 5 is a top view of the multilayer printed circuit board shown in FIG. 3 with one end overlapped with the origin of xy orthogonal coordinates. As shown in FIG. 5, in the printed circuit board with a horizontal side a and a vertical side b, coordinates of the port 301, the port 302 and the port 303 are assumed to be P1 (x1, y1), P2 (x2, y2) and P3 (x3, y3). FIG. 6 is a diagram showing an equivalent circuit model of meshed power source-ground planes of the multilayer printed circuit board 300. As shown in FIG. 6, the horizontal side a of the multilayer printed circuit board is equally divided into five and the vertical side b is equally divided into four to have meshes whose horizontal side is $\Delta x$ and vertical side is $\Delta y$. The port 301, the port 302 and the port 303 correspond to a node 601, a node 602 and a node 603, respectively.

Figure 7:
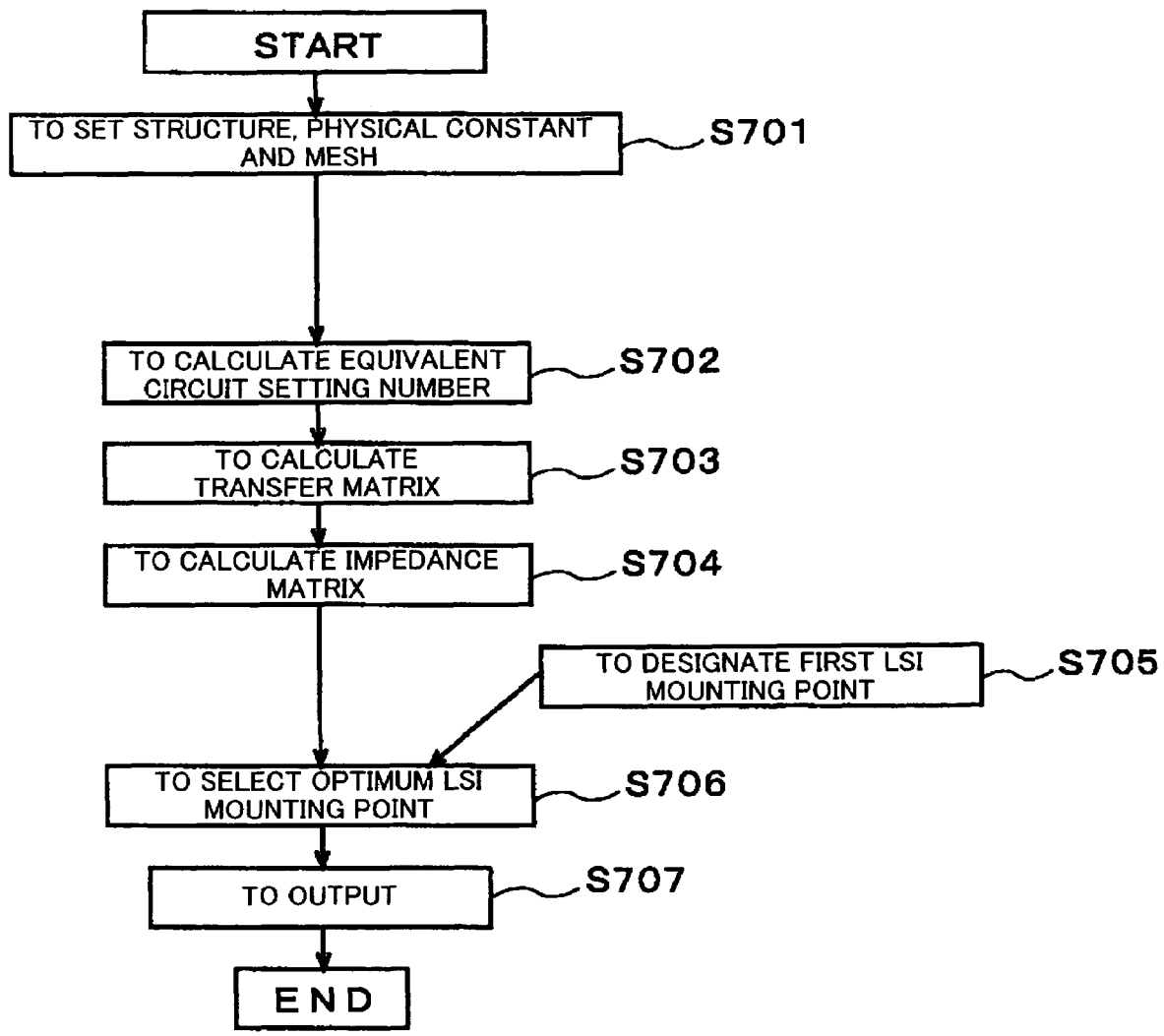
FIG. 7 is a flow chart showing a procedure of analysis processing of an integrated power source system analysis system related to the first embodiment of the present invention.

Next, operation of thus structured integrated power source system analysis system according to the present embodiment will be described. In the multilayer printed circuit board 300 having two pairs of power source-ground planes in FIG. 3, when the LSI-1 package 304 is disposed at the port 301, on which of the port 302 and the port 303, the LSI-2 package 305 should be placed is determined in the present embodiment. FIG. 7 is a flow chart showing a procedure of analysis processing of the integrated power source system analysis system according to the present embodiment. As shown in FIG. 7, first, input information about the structure of the multilayer printed circuit board, a physical constant and meshes (Step S701). Here, input information related to the number of layers of the multilayer printed circuit board, its structure, a plurality of LSI mounting candidate points and the like to the multilayer printed circuit board structure input unit 201. Here, assuming that the LSI mounting candidate points are N points, these points are expressed by a vector P as shown in Mathematical Expression 1.

$$P = (P_1, \ldots, P_N)^T \quad \text{(Mathematical Expression 1)}$$

Assume here in FIG. 5 that P1: (x1, y1)=(20, 20) (mm), P2: (x2, y2)=(60, 20) (mm) and P3: (x3, y3)=(80, 20) (mm). Also assume that the horizontal side a of the printed circuit board is 100 mm and the vertical side b is 80 mm. Further assume that a thickness h between the power source-ground planes is 1 mm, a via minor diameter is 0.5 mm and a via major diameter is 1 mm. These are input as the information related to the structure of the multilayer printed circuit board.

To the physical constant input unit 202, a material constant of a medium for use in the multilayer printed circuit board and a frequency band to be analyzed are input. Assume here that a dielectric constant er of the board is 4.3 and a frequency used is 300 MHz. Moreover, to the mesh information input unit 203, the number of meshes and a mesh interval for generating the equivalent circuit model are input. As shown in FIG. 6, assume here that the horizontal side a is equally divided into five and the vertical side b is equally divided into four.

Figure 12:
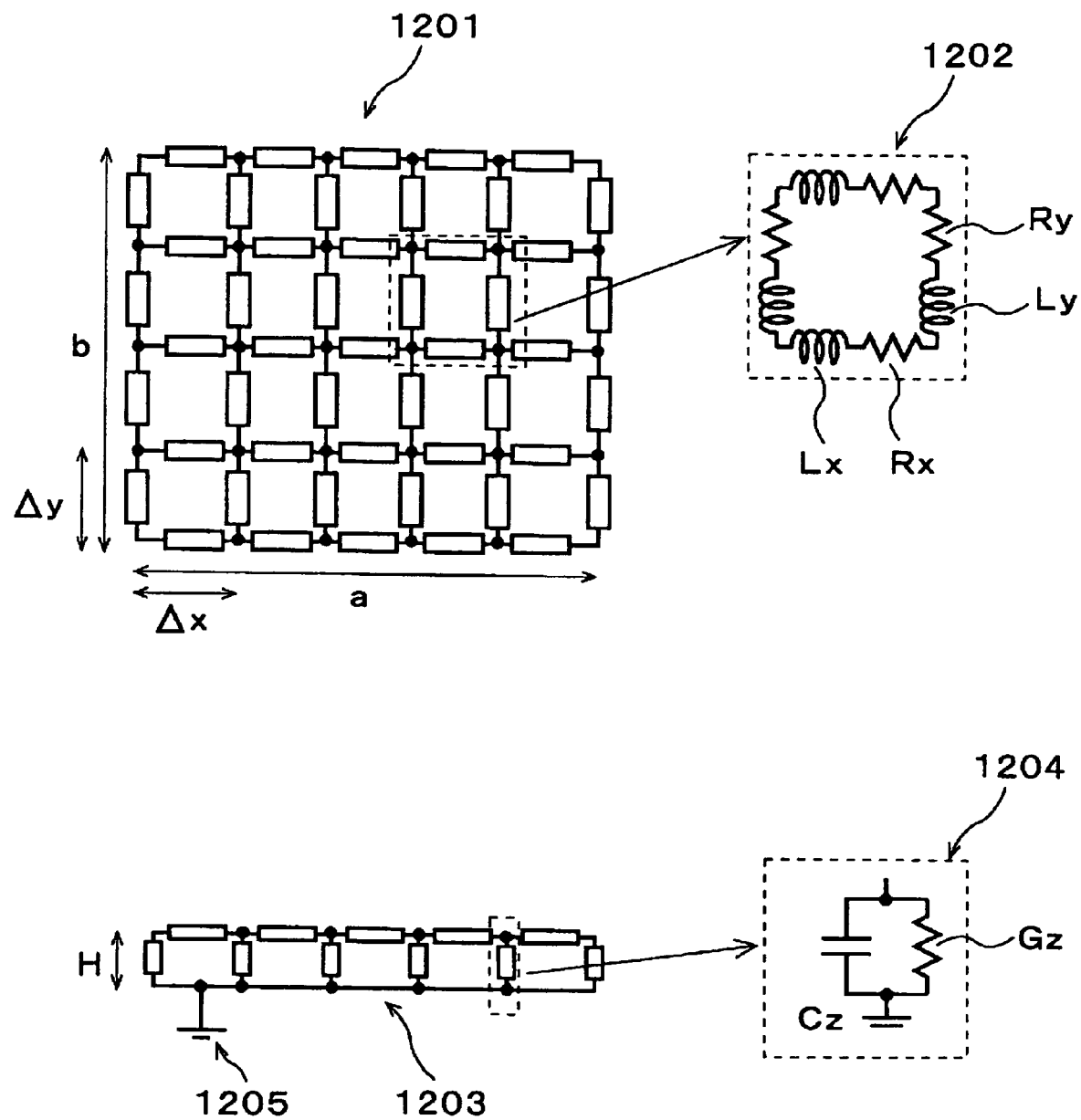
FIG. 12 is a diagram for use in explaining an equivalent circuit of a pair of power source-ground planes.
Figure 13:
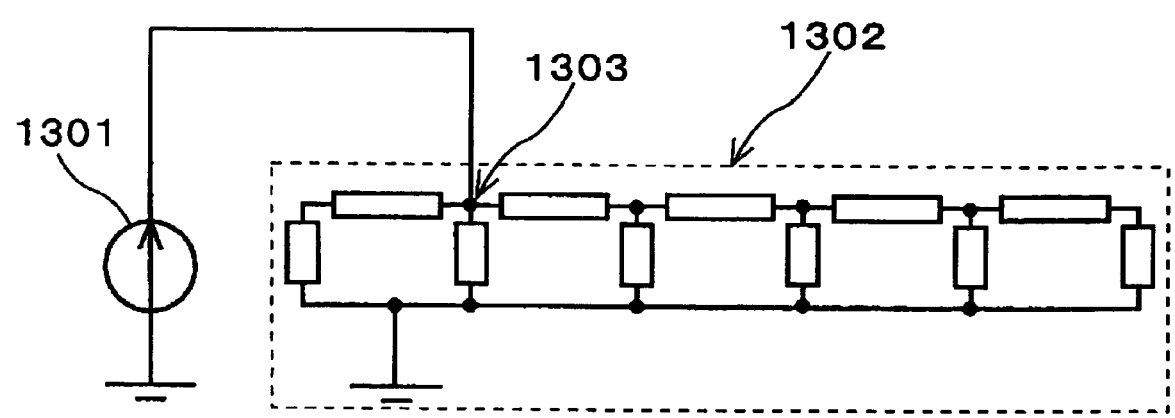
FIG. 13 is a diagram for use in explaining an equivalent circuit of a pair of power source-ground planes in a case where a power source terminal of an LSI is considered as a current source.

Next, generate an equivalent circuit model of the multilayer printed circuit board (Step S702). At the equivalent circuit constant calculation unit 204, generate an equivalent circuit for a mesh designated by the mesh information input unit. Here, in a case of a printed circuit board having one pair of power source-ground planes, the conventional equivalent circuit model 1203 shown in FIG. 12 can be used. In a case of a printed circuit board having two or more pairs of power source-ground planes, the equivalent circuit model for a multilayer printed circuit board shown in FIG. 4 is generated. Next, generate a transfer matrix with an LSI power source terminal mounting candidate point on the uppermost layer as an input and an LSI power source terminal mounting candidate point on the lowermost layer as an output (Step S703) and convert the transfer matrix into an impedance matrix (Step S704). Here, the impedance matrix calculation unit 205 calculates an impedance matrix with the plurality of LSI mounting candidate points as an input by using the equivalent circuit constant calculation unit 204. More specifically, with respect to the vector P of the number N (N≧1) of LSI candidate points which is designated by the multilayer printed circuit board structure input unit, with an input current and an input voltage denoted as a vector I and a vector V as represented in Mathematical Expressions 2 and 3, respectively, calculate each element zij (1≦i, j≦N) of a matrix satisfying Mathematical Expression 4.

$$I = (I_1, \ldots, I_N)^T \quad \text{(Mathematical Expression 2)}$$

$$V = (V_1, \ldots, V_N)^T \quad \text{(Mathematical Expression 3)}$$

$$V = ZI \quad \text{(Mathematical Expression 4)}$$

Here, as an example of an impedance matrix generation method, a multilayer printed circuit board analysis method will be described. For example, used is a multilayer printed circuit board having two pairs of power source-ground planes and three LSI mounting candidate points on the uppermost layer as shown in FIG. 3. Although if such an equivalent circuit as shown in FIG. 4 can be generated, an impedance matrix with the port 301, the port 302 and the port 303 as an input can be generated by using a circuit solver such as a SPICE, description will be here made in brief of an algorithm for obtaining an impedance matrix more efficiently.

With respect to one pair of power source-ground planes, assume that an input current and an input voltage flowing from the upper layer through the number N of vias are denoted as a vector Iin and a vector Vin as represented in Mathematical Expression 5 and Mathematical Expression 6, respectively, and an output current and an output voltage flowing to the lower layer are denoted as a vector Iout and a vector Vout as represented in Mathematical Expression 7 and Mathematical Expression 8, respectively.

$$I_{in} = (I_{in,1}, \ldots, I_{in,N})^T \quad \text{(Mathematical Expression 5)}$$

$$V_{in} = (V_{in,1}, \ldots, V_{in,N})^T \quad \text{(Mathematical Expression 6)}$$

$$I_{out} = (I_{out,1}, \ldots, I_{out,N})^T \quad \text{(Mathematical Expression 7)}$$

$$V_{out} = (V_{out,1}, \ldots, V_{out,N})^T \quad \text{(Mathematical Expression 8)}$$

In this case, the relationship expressed by the following Mathematical Expression 9 holds among the input current, the input voltage, the output current and the output voltage.

$$\begin{bmatrix} V_{in} \\ I_{in} \end{bmatrix} = \begin{bmatrix} I & 0 \\ Y_{via} & I \end{bmatrix} \begin{bmatrix} V_{out} \\ I_{out} \end{bmatrix} \quad \text{(Mathematical Expression 9)}$$

Here, the vector I is a unit matrix. Vector Yvia is an admittance matrix obtained when, assuming that all the nodes of the equivalent circuit model of one pair of power source-ground planes have an input current, after generating an admittance matrix vector Y with a current and a voltage at these nodes as an input, a relationship expression between a current and a voltage related only to a node having a via is established with an input current of a node having no via as 0. Assume, for example, that a matrix element yij ($1 \leq i, j \leq M$) of the admittance matrix vector Y of one pair of power source-ground planes having the number M of nodes, an input current Ii ($1 \leq I \leq M$) and an input voltage Vi ($1 \leq I \leq M$) satisfy the relationship of the following Mathematical Expression 10.

$$I_1 = y_{1,1} V_1 + \ldots + y_{1,M} V_M$$

$$I_2 = y_{2,1} V_1 + \ldots + y_{2,M} V_M$$

.
.
.

$$I_M = y_{M,1} V_1 + \ldots + y_{M,M} V_M \quad \text{(Mathematical Expression 10)}$$

With respect to a node having no via, because the input current is 0, Mathematical Expression 11 set forth below holds for a voltage of the node:

$$V_i = -\frac{1}{y_{i,i}} \sum_{k \neq i}^{N} y_{i,k} V_k \quad \text{(Mathematical Expression 11)}$$

where $$\sum_{k \neq i}^{N}$$

represents a total sum related to all the nodes from 1 to N except i.

In the above-described Mathematical Expression 10, an expression related to a current of other node than the node i is represented by Mathematical Expression 12 set forth below.

$$I_j = y_{j,1} V_1 + \ldots + y_{j,N} V_N \quad (j \neq i) \quad \text{(Mathematical Expression 12)}$$

When substituting the above Mathematical Expression 11 for the above Mathematical Expression 12, Mathematical Expression 13 set forth below holds.

$$I_{j,(j \neq i)} = \sum_{k \neq 1}^{N} \left( y_{j,k} - \frac{y_{j,i}}{y_{i,i}} y_{i,k} \right) V_k \quad \text{(Mathematical Expression 13)}$$

In the above Mathematical Expression 13, the left side Ij ($j \neq i$) represents a current of other node than i. Repeating such operation as described above ultimately obtains the admittance matrix vector Yvia which correlates an input current and an input voltage related to a node having a via.

An equivalent circuit constant of a via part which joins the respective layers is in general calculated by analyses, experiments or the like using three-dimensional electro-magnetic field analysis. More specifically, the circuit constant is represented as an inductance. Assuming, for example, that an inductance value is Lvia, 1 (i=1, ..., N), Mathematical Expression 14 set forth below holds among an input current, an input voltage, an output current and an output voltage for a via.

$$\begin{bmatrix} V_{in} \\ I_{in} \end{bmatrix} = \begin{bmatrix} I & L_{via} \\ 0 & I \end{bmatrix} \begin{bmatrix} V_{out} \\ I_{out} \end{bmatrix} \quad \text{(Mathematical Expression 14)}$$

Here, a vector Lvia is represented by Mathematical Expression 15 set forth below.

$$L_{via} = \text{diag}(L_{via,1}, \ldots, L_{via,N}) \quad \text{Mathematical Expression 15)}$$

By using these expressions, Mathematical Expression 16 set forth below holds when with respect to the multilayer printed circuit board having N pairs of power source-ground planes, an input current and an input voltage of an LSI mounting candidate point at the uppermost layer are represented as the vector Iin and the vector Vin, respectively, Yvia and Lvia at the i-th counted from the upper layer are represented as Yvia, 1 and Lvia, 1, respectively, and an output current and an output voltage of the multilayer printed circuit board at the lowermost layer are represented as Iout and Vout, respectively.

$$\begin{bmatrix} V_{in} \\ I_{in} \end{bmatrix} = \begin{bmatrix} I & 0 \\ Y_{via,1} & I \end{bmatrix} \begin{bmatrix} I & L_{via,1} \\ 0 & I \end{bmatrix} \quad \text{(Mathematical Expression 16)}$$

$$\begin{bmatrix} I & 0 \\ Y_{via,2} & I \end{bmatrix} \begin{bmatrix} I & L_{via,2} \\ 0 & I \end{bmatrix}$$

$$\ldots \ldots \begin{bmatrix} I & L_{via,N-1} \\ 0 & I \end{bmatrix}$$

$$\begin{bmatrix} I & 0 \\ Y_{via,N} & I \end{bmatrix} \begin{bmatrix} V_{out} \\ I_{out} \end{bmatrix}$$

$$= T \begin{bmatrix} V_{out} \\ I_{out} \end{bmatrix}$$

$$T = \begin{bmatrix} I & 0 \\ Y_1 & I \end{bmatrix} \begin{bmatrix} I & L_{via,1} \\ 0 & I \end{bmatrix} \begin{bmatrix} I & 0 \\ Y_2 & I \end{bmatrix}$$

$$\begin{bmatrix} I & L_{via,2} \\ 0 & I \end{bmatrix} \ldots \ldots \begin{bmatrix} I & L_{via,N-1} \\ 0 & I \end{bmatrix} \begin{bmatrix} I & 0 \\ Y_N & I \end{bmatrix}$$

When there exists no output current in the lowermost layer, Iout is assumed to be 0. By transposing the input current and the output current to the right side and the input voltage and the output voltage to the left side in thus obtained Mathematical Expression 16, an impedance matrix satisfying Mathematical Expression 17 set forth below is obtained.

$$\begin{bmatrix} V_{in} \\ V_{out} \end{bmatrix} = Z \begin{bmatrix} I_{in} \\ I_{out} \end{bmatrix}$$ (Mathematical Expression 17)

One characteristic of the present embodiment is calculating interaction between LSI power source terminals with the above Mathematical Expression 17 as an impedance matrix. As an impedance matrix generation method, a circuit solver such as a SPICE may be used for generation.

After calculating the impedance matrix at Step S704, input the first LSI mounting candidate point (Step S705). At the first LSI mounting point designation unit 206, designate a place of an LSI to be mounted first according to conditions of design from the vector P of the plurality of LSIs mounting candidate points designated by the multilayer printed circuit board structure information input unit 201. Assume here, for example, that the place is P1. Next, select an optimum LSI mounting point (Step S706). At the optimum LSI mounting point evaluation unit 207, sort absolute values |zij| (i=2, . . . , N) of a mutual impedance with the first LSI mounting point in an ascending order from among the LSI mounting candidate points excluding the first LSI mounting point P1 which is designated by the first LSI mounting point designation unit 206. Lastly, output the optimum LSI mounting point and the remaining LSI mounting candidate points in order (Step S707) to end all the processing. At the optimum LSI mounting point display unit 208, display the candidate points and the absolute values |zij|(i=2, . . . , N) of the mutual impedance in the order of sorting by the optimum LSI mounting point evaluation unit 207. Here, absolute values of a mutual impedance Z12 between the port 301 and the port 302 and a mutual impedance Z13 between the port 301 and the port 303 are compared to output and display an optimum mounting point of the LSI-2 package 305 as the port 302 when |Z12|<|Z13| and an optimum mounting point of the LSI-2 package 305 as the port 303 when |Z12|>|Z13|.

Figure 8:
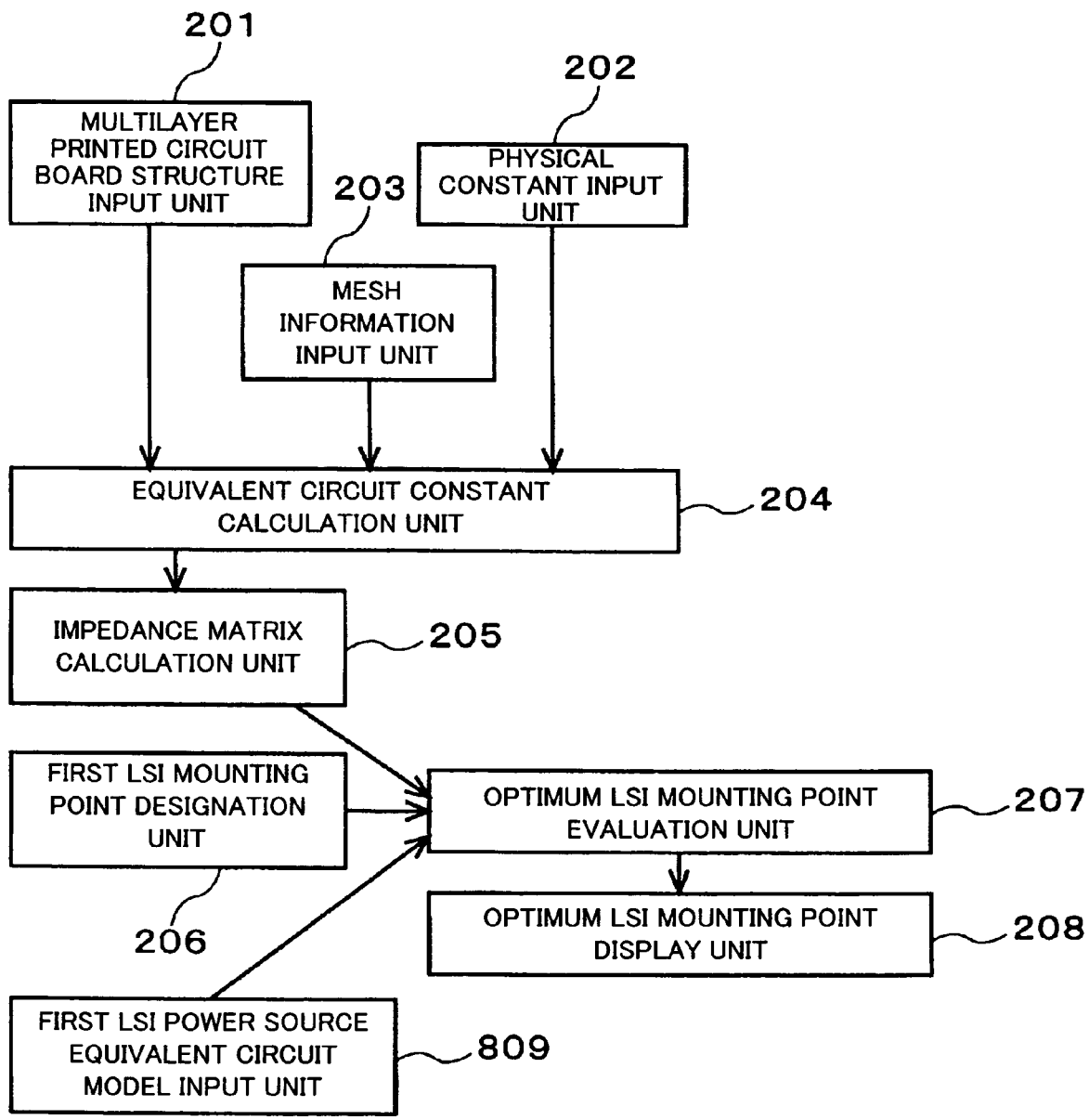
FIG. 8 is a block diagram for use in explaining a second embodiment of the present invention.
Figure 9:
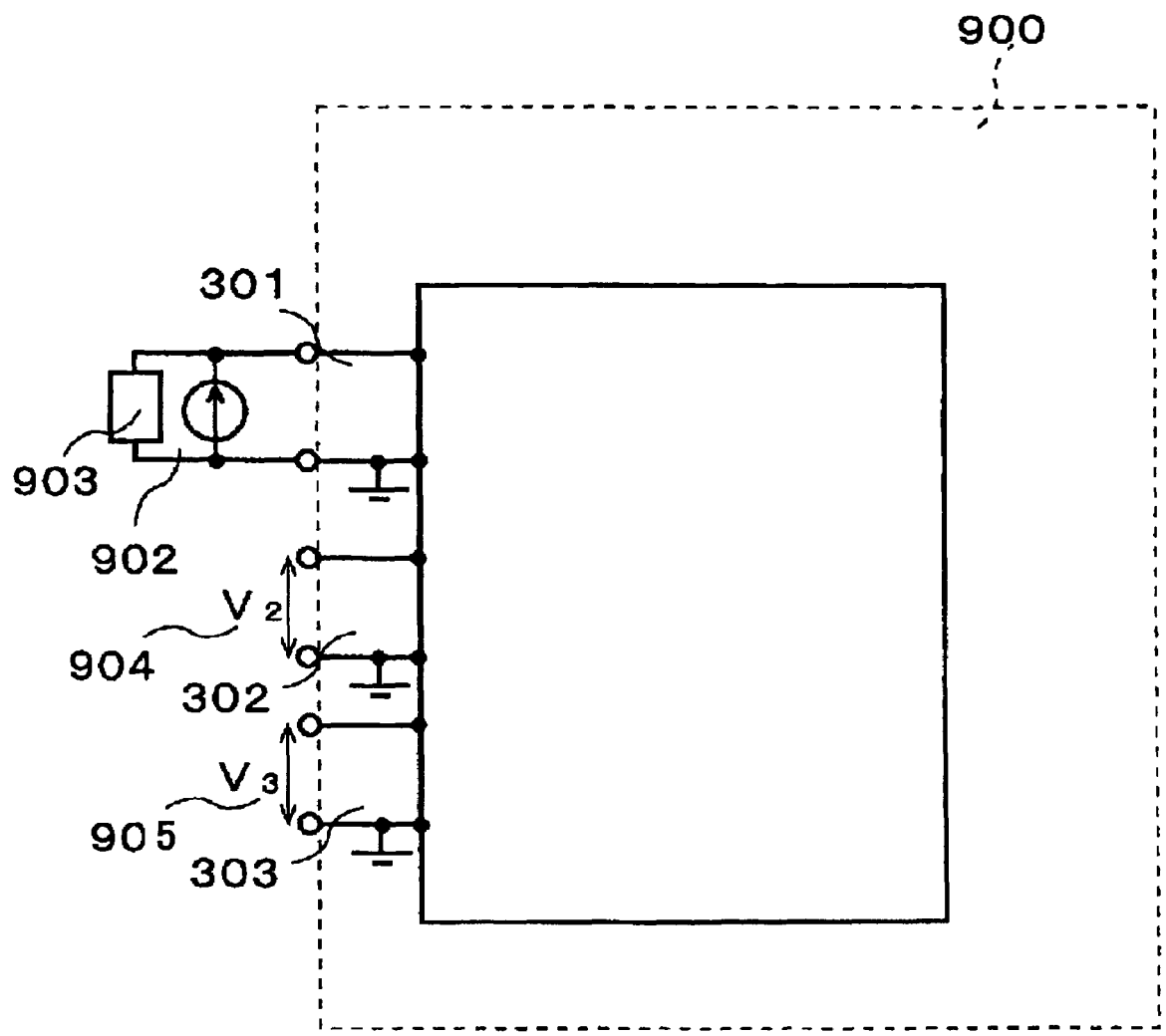
FIG. 9 is a diagram for use in explaining a system including an LSI power source equivalent circuit model and a multilayer printed circuit board according to the second embodiment of the present invention.

Next, a second embodiment of the present invention will be described. FIG. 8 is a block diagram functionally showing a structure of an integrated power source system analysis system according to the present embodiment. FIG. 8, which is a block diagram substantially following FIG. 2, is characterized in that a first LSI power source equivalent circuit model input unit 809 is newly connected to the optimum LSI mounting point evaluation unit 207. In addition, FIG. 9 is a diagram for use in explaining an optimum LSI point evaluation method when a power source equivalent circuit model of an LSI is used in the present embodiment. In FIG. 9, 900 represents a block showing a circuit system having an impedance matrix vector Z which is represented with a plurality of power source-ground terminals of the above multilayer printed circuit board as an input. In addition, 901 represents a power source equivalent circuit model of an LSI to be mounted first, which includes a current source 902 and an internal impedance 903. Furthermore, 904 and 905 represent power source fluctuation values of the remaining LSI mounting points.

Figure 10:
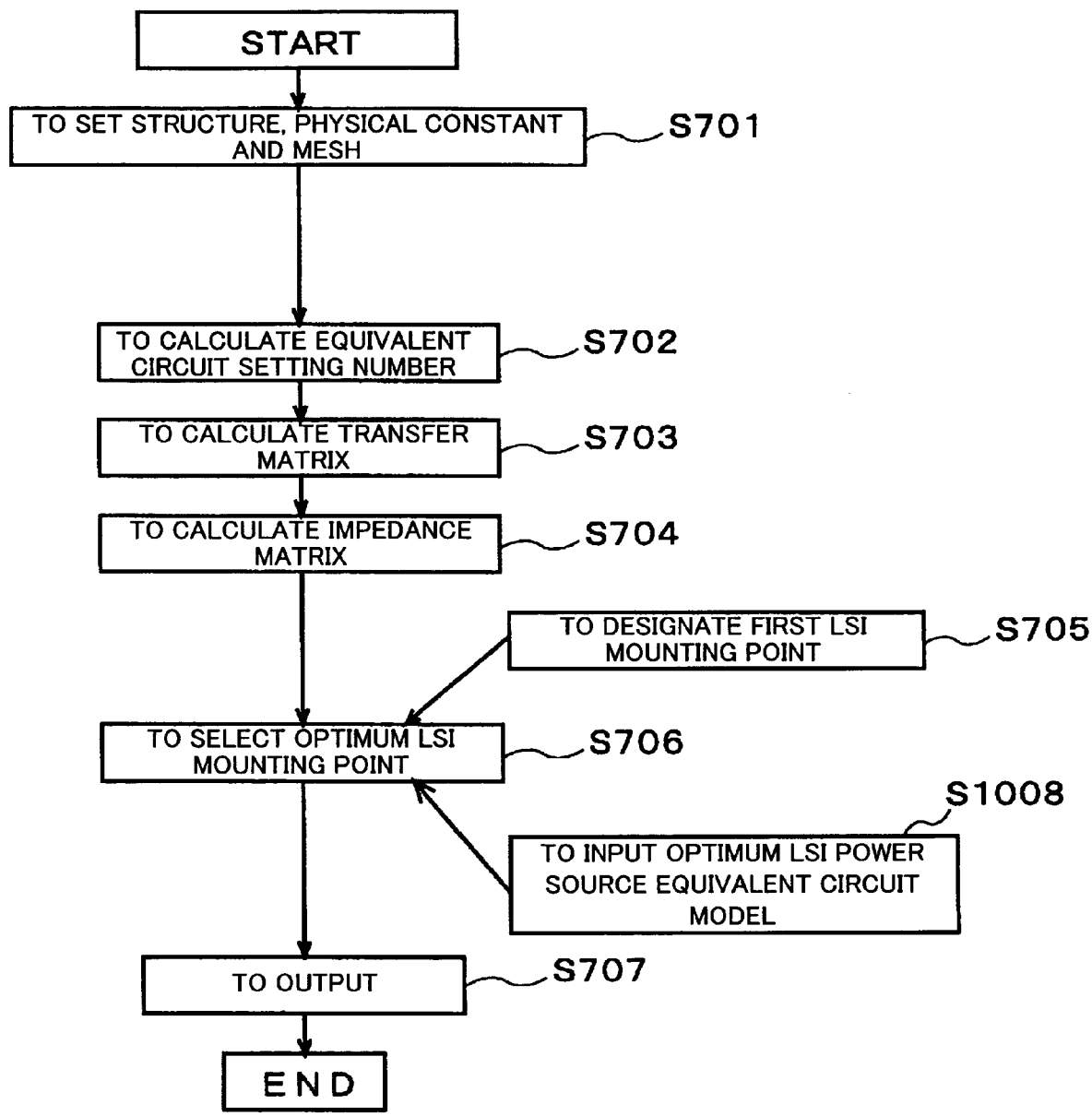
FIG. 10 is a flow chart showing a procedure of analysis processing of an integrated power source system analysis system related to the second embodiment of the present invention.
Figure 11:
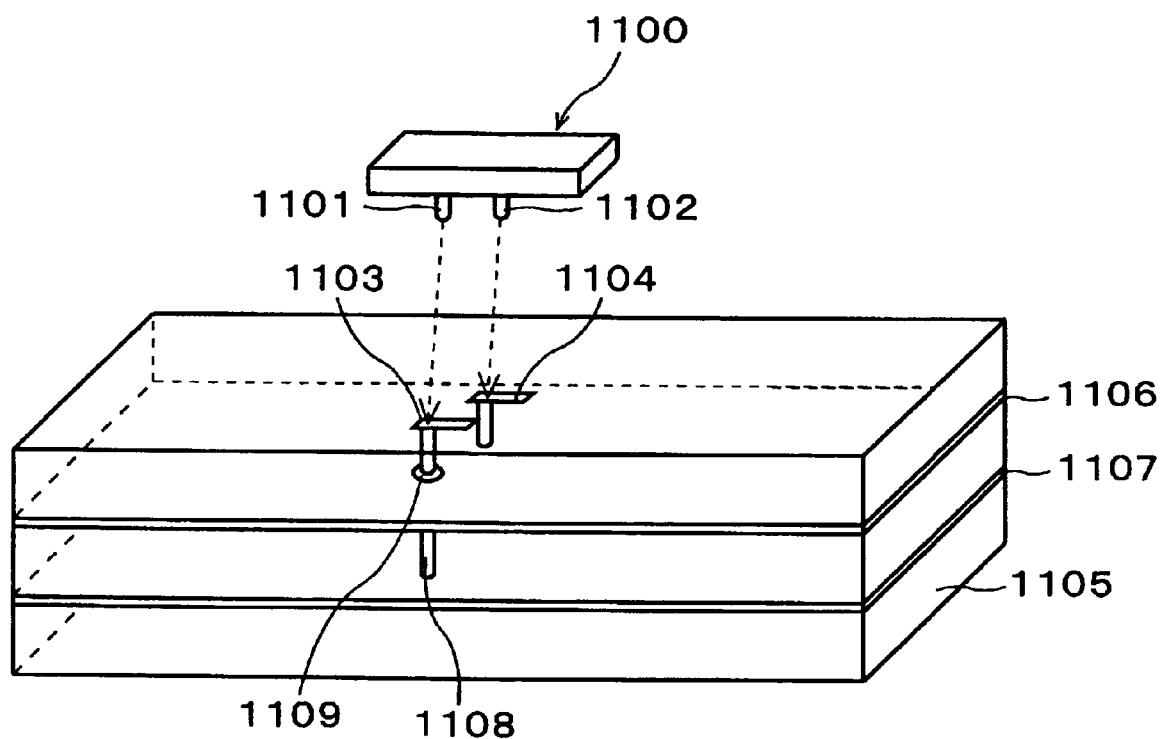
FIG. 11 is a diagram for use in explaining a structure of a multilayer printed circuit board including a pair of power source-ground planes and a pair of power source-ground terminals for mounting an LSI.

Next, operation of thus structured integrated power source system analysis system according to the present embodiment will be described. FIG. 10 is a flow chart showing a procedure of analysis processing of the integrated power source system analysis system according to the present embodiment. FIG. 10, which substantially follows FIG. 7, is characterized in further including Step S1008 of inputting a power source equivalent circuit model of a first LSI. In this case, at the optimum LSI mounting point selection step (Step S706), an optimum LSI mounting point is selected by using both information at the first LSI mounting point designation Step S705 and at the first LSI power source equivalent circuit model input Step S1008. At this time, in FIG. 8, with a power source equivalent circuit model applied as a load to a port relevant to a first LSI mounting point in the impedance matrix obtained by the impedance matrix calculation unit 205, the optimum LSI mounting point evaluation unit 207 calculates voltage fluctuations at the remaining mounting candidate points and sorts the values in an ascending order. In addition, the optimum LSI mounting point display unit displays candidate points and the amounts of voltage fluctuation in the order of sorting executed by the optimum LSI mounting point evaluation unit 208.

In the embodiments of the present invention, as to a power source equivalent circuit model of an LSI, only an LSI to be mounted first is taken into consideration, while also for other LSIs to be applied, a power source equivalent circuit model can be used to evaluate interconnection between a plurality of LSI power source terminals.

As described in the foregoing, according to the embodiments of the present invention, a point at which power source systems hardly affect to each other can be preferentially selected from among a plurality of LSI mounting candidate points of the multilayer printed circuit board. This is quite essential in the field of circuit design and the field of EMC (Electro Magnetic Compatibility) which require high-speed and highly precise power source system analyses with LSI design and printed circuit board design integrated.

The multilayer circuit board analysis method described in the embodiment of the present invention is realized by executing a program prepared in advance by a computer such as a personal computer or a workstation. The program is recorded in such a recording medium readable by a computer as a hard disk, a CD-ROM (Compact Disk Read Only Memory), an MO (Magneto-Optical Disk) or a DVD (Digital Versatile Disc) and read from the recording medium by the computer for the execution.

According to the integrated power source system analysis system and the integrated power source system analysis method of the present invention, when a plurality of LSIs are mounted on a multilayer printed circuit board, design outlines of a power source system integrating a printed circuit board and an LSI can be obtained taking interaction between power source systems of LSIs through the printed circuit board into consideration.

The invention claimed is:

1. An integrated power source system analysis system, comprising:

unit which calculates an equivalent circuit constant based on information related to a mesh for generating an equivalent circuit of a multilayer printed circuit board having a plurality of mounting candidate points at which a plurality of LSIs can be mounted;

unit which calculates an impedance matrix with power source and ground terminals of the multilayer printed circuit board as an input by using said equivalent circuit constant;

unit which selects a first LSI mounting candidate point where a first LSI is to be mounted from among said LSI mounting candidate points; and unit which sequentially selects a second LSI mounting candidate point for mounting a second LSI at which interaction with a power source supply system of said first LSI is lowest by using said impedance matrix, wherein said second LSI mounting candidate point is selected from among the plurality of LSI mounting candidate points excluding said first LSI mounting candidate point from said plurality of LSI mounting candidate points.

2. The integrated power source system analysis system according to claim 1, further comprising:
unit which receives input of information related to a structure of the multilayer printed circuit board having a plurality of candidate points at which a plurality of LSIs can be mounted and a physical constant, and unit which receives input of information related to a mesh for generating an equivalent circuit of said multilayer printed circuit board.

3. The integrated power source system analysis system according to claim 1 or claim 2, further comprising:
unit which, after inserting a power source model on the LSI side as a load into a power source terminal for a specific LSI on the multilayer printed circuit board by using said impedance matrix, calculates voltage fluctuation at power source terminals and ground terminals for the remaining LSIs to sequentially select a place at which interaction with a power source system of the specific LSI will hardly occur.

4. The integrated power source system analysis system according to claim 1 or claim 2, comprising:
unit which, at the time of generation of said impedance matrix, generates, from an expression of a relationship among an admittance matrix determined by meshing the multilayer printed circuit board, an input current and an input voltage, an admittance matrix related only to a node having a via with an input current of a node having no via as 0 to generate an impedance matrix by using said admittance matrix.

5. The integrated power source system analysis system according to claim 1 or claim 2, wherein interaction of power source systems of the plurality of LSIs is evaluated by using an impedance matrix of a multilayer printed circuit board having one or two or more pairs of power source-ground planes.

6. The integrated power source system analysis system according to claim 1 or claim 2, wherein interaction of power source systems of the plurality of LSIs is evaluated by using an impedance matrix of a multilayer printed circuit board having one or two or more pairs of power source-ground planes and a power source equivalent circuit model of the plurality of LSIs.

7. An integrated power source system analysis method, comprising:
calculating an equivalent circuit constant based on mesh information for generating an equivalent circuit of a multilayer printed circuit board having a plurality of mounting candidate points at which a plurality of LSIs can be mounted;
calculating an impedance matrix with power source and ground terminals of the multilayer printed circuit board as an input by using said equivalent circuit constant; and
selecting a first LSI mounting candidate point where a first LSI is to be mounted from among said LSI mounting candidate points, and
sequentially selecting a second LSI mounting candidate point for mounting a second LSI at which interaction with a power source supply system of the first LSI is lowest by using said impedance matrix, wherein said second LSI mounting candidate point is selected from among the plurality of LSI mounting candidate points excluding said first LSI mounting candidate point from said plurality of LSI mounting candidate points:
wherein a computer processor operates to perform at least one of said calculating an equivalent circuit constant, calculating an impedance matrix, selecting a first LSI mounting candidate point, and sequentially selecting a second LSI mounting candidate point.

8. The integrated power source system analysis method according to claim 7, comprising the step of receiving input of information related to a structure of the multilayer printed circuit board having a plurality of candidate points at which a plurality of LSIs can be mounted and a physical constant, and the step of receiving input of information related to a mesh for generating an equivalent circuit of said multilayer printed circuit board.

9. The integrated power source system analysis method according to claim 7 or claim 8, wherein after inserting a power source model on the LSI side as a load into a power source terminal for a specific LSI on the multilayer printed circuit board by using said impedance matrix, a place at which interaction with a power source system of the specific LSI will hardly occur is sequentially selected by calculating voltage fluctuation at power source terminals and ground terminals for the remaining LSIs.

10. The integrated power source system analysis method according to claim 7 or claim 8, wherein at the time of generation of said impedance matrix, from an expression of a relationship among an admittance matrix determined by meshing the multilayer printed circuit board, an input current and an input voltage, an admittance matrix related only to a node having a via is generated with an input current of a node having no via as 0 to generate an impedance matrix by using said admittance matrix.

11. The integrated power source system analysis method according to claim 7 or claim 8, wherein interaction of power source systems of the plurality of LSIs is evaluated by using an impedance matrix of a multilayer printed circuit board having one or two or more pairs of power source-ground planes.

12. The integrated power source system analysis method according to claim 7 or claim 8, wherein interaction of power source systems of the plurality of LSIs is evaluated by using an impedance matrix of a multilayer printed circuit board having one or two or more pairs of power source-ground planes and a power source equivalent circuit model of the plurality of LSIs.

13. A multilayer printed circuit board, which is mounted with a plurality of LSIs by using the order of LSI mounting candidate points obtained by the integrated power source system analysis system according to claim 1 or claim 2.

* * * * *

UNITED STATES PATENT AND TRADEMARK OFFICE
CERTIFICATE OF CORRECTION

PATENT NO. : 7,669,162 B2
APPLICATION NO. : 11/547200
DATED : February 23, 2010
INVENTOR(S) : Naoki Kobayashi and Takashi Harada It is certified that error appears in the above-identified patent and that said Letters Patent is hereby corrected as shown below:

Column 7, Line 38, delete "$I_i = y_{1,\,1} V_1 + ... + y_{i,M} V_M$" and insert --$I_1 = y_{1,1} V_1 + ... + y_{1,M} V_M$--

Signed and Sealed this

Twenty-sixth Day of October, 2010

David J. Kappos
*Director of the United States Patent and Trademark Office*